(12) United States Patent
Noda

(10) Patent No.: US 12,080,992 B2
(45) Date of Patent: Sep. 3, 2024

(54) LIGHT EMITTING DEVICE AND PROJECTOR

(71) Applicant: SEIKO EPSON CORPORATION, Tokyo (JP)

(72) Inventor: Takafumi Noda, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 17/841,707

(22) Filed: Jun. 16, 2022

(65) Prior Publication Data

US 2022/0311205 A1 Sep. 29, 2022

Related U.S. Application Data

(63) Continuation of application No. 16/635,216, filed as application No. PCT/JP2018/027709 on Jul. 24, 2018, now Pat. No. 11,394,171.

(30) Foreign Application Priority Data

Jul. 31, 2017 (JP) .................... 2017-147577

(51) Int. Cl.
  *H01S 5/042* (2006.01)
  *G03B 21/20* (2006.01)
  *H01S 5/026* (2006.01)
  *H01S 5/12* (2021.01)
  *H01S 5/125* (2006.01)
  (Continued)

(52) U.S. Cl.
  CPC ...... *H01S 5/04256* (2019.08); *G03B 21/2033* (2013.01); *H01S 5/0261* (2013.01); *H01S 5/04254* (2019.08); *H01S 5/12* (2013.01);

*H01S 5/125* (2013.01); *H01S 5/18308* (2013.01); *H01S 5/34313* (2013.01); *H01S 5/34333* (2013.01); *H01S 5/4025* (2013.01); *G03B 21/2013* (2013.01); *G03B 33/12* (2013.01)

(58) Field of Classification Search
  CPC ............ H01S 5/04256; H01S 5/04254; H01S 5/18308; H01S 5/34313; H01S 5/34333; H01S 5/4025; G03B 21/2033
  See application file for complete search history.

(56) References Cited

U.S. PATENT DOCUMENTS 5,362,972 A  11/1994 Yazawa et al.
5,392,307 A * 2/1995 Sugiyama ........... H01S 5/18361
                                                   372/45.01
(Continued)

FOREIGN PATENT DOCUMENTS

CN   106684153 A   5/2017
JP   H04-118916 A  4/1992
(Continued)

OTHER PUBLICATIONS

English Translation of JP2009-105182 (Year: 2009).*

*Primary Examiner* — Yuanda Zhang
(74) *Attorney, Agent, or Firm* — Harness, Dickey & Pierce, P.L.C.

(57) ABSTRACT

A light emitting device is provided including a switching element. The light emitting device includes a light emitting unit having a plurality of nanostructures that can emit lights with injection of currents, and a transistor provided in correspondence with the light emitting unit and controlling amounts of the currents injected in the nanostructures.

13 Claims, 16 Drawing Sheets

(51) Int. Cl.
*H01S 5/183* (2006.01)
*H01S 5/343* (2006.01)
*H01S 5/40* (2006.01)
*G03B 33/12* (2006.01)

(56) References Cited

U.S. PATENT DOCUMENTS

| | | |
|---|---|---|
| 8,791,470 B2 | 7/2014 | Wober |
| 2004/0157354 A1 | 8/2004 | Kuriyama et al. |
| 2004/0253758 A1 | 12/2004 | Jung et al. |
| 2006/0081868 A1* | 4/2006 | Kotani ................... H01S 5/22 |
| | | 257/99 |
| 2006/0098705 A1 | 5/2006 | Wang et al. |
| 2016/0197064 A1 | 7/2016 | Bouvier et al. |
| 2017/0123172 A1* | 5/2017 | Adachi ................... H01S 5/343 |
| 2018/0366906 A1* | 12/2018 | Hamaguchi ............. H01S 5/028 |

FOREIGN PATENT DOCUMENTS

| | | |
|---|---|---|
| JP | 2004-193527 A | 7/2004 |
| JP | 2005-005266 A | 1/2005 |
| JP | 2007-049063 A | 2/2007 |
| JP | 2009-105182 A | 5/2009 |
| JP | 2009-518680 A | 5/2009 |
| JP | 2015-522837 A | 8/2015 |
| WO | 2007-066920 A1 | 6/2007 |
| WO | 2013-167152 A1 | 11/2013 |

\* cited by examiner

LIGHT EMITTING DEVICE AND PROJECTOR

CROSS-REFERENCE TO RELATED APPLICATIONS

This application is a continuation application of U.S. patent application Ser. No. 16/635,216 filed Jan. 30, 2020, which is a National Phase of International Application No. PCT/JP2018/027709, filed on Jul. 24, 2018 and claims the benefit of priority from Japanese Patent Application No. 2017-147577, filed Jul. 31, 2017. The entire disclosures of all of the above applications are incorporated by reference herein in their entirety.

BACKGROUND

1. Technical Field

This disclosure relates to a light emitting device and a projector.

2. Background Art

Semiconductor lasers are expected as high-intensity next-generation light sources. Among others, semiconductor lasers using nanostructures (nanocolumns) are expected to realize high-power light emission at narrow radiation angles due to the effect of photonic crystal by the nanostructures. The semiconductor lasers are applied as e.g. light sources of projectors.

For example, in JP-A-2007-49063, a semiconductor light emitting element in which a reflection layer of a metal film is formed on a substrate and a plurality of nanocolumns are formed on the reflection layer is described.

However, in JP-A-2007-49063, a switching element for flowing or not flowing a current (for turning ON/OFF the current to be injected) in the semiconductor light emitting element (light emitting unit) is not described.

SUMMARY

One of the purposes according to several aspects of the disclosure is to provide a light emitting device including a switching element. Or, one of the purposes according to the several aspects of the disclosure is to provide a projector including the light emitting device.

A light emitting device according to the disclosure includes a light emitting unit having a plurality of nanostructures that can emit lights with injection of currents, and a transistor provided in correspondence with the light emitting unit and controlling amounts of the currents injected in the nanostructures.

The light emitting device includes the transistor, and thereby, may control an amount of emitted light of the light emitting unit.

The light emitting device according to the disclosure includes a base, and a first semiconductor layer provided on the base, and the nanostructures may be columnar portions projecting from the first semiconductor layer.

In the light emitting device, a possibility that dislocation generated due to a difference between the lattice constant of the base and the lattice constant of the first semiconductor layer exists in regions at a fixed height or more of the nanostructures may be reduced.

In the light emitting device according to the disclosure, the nanostructure may have a second semiconductor layer, a third semiconductor layer having a different conductivity type from that of the second semiconductor layer, and a light emitting layer that is provided between the second semiconductor layer and the third semiconductor layer and can emit a light with injection of a current, and the second semiconductor layer may be provided between the base and the light emitting layer.

In the light emitting device, a possibility that dislocation generated due to a difference between the lattice constant of the base and the lattice constant of the first semiconductor layer exists in the light emitting layer may be reduced.

In the light emitting device according to the disclosure, the transistor may have a source region and a drain region, a channel region between the source region and the drain region, and a gate that controls a current flowing in the channel region, and the source region and the drain region may be provided in the first semiconductor layer.

In the light emitting device, the transistor and the light emitting unit may be formed on the same substrate (single base). Therefore, in the light emitting device, downsizing may be realized compared to the case where the transistor and the light emitting unit are provided on separate substrates.

In the light emitting device according to the disclosure, the source region or the drain region may be electrically coupled to the second semiconductor layer.

In the light emitting device, the amount of current injected in the light emitting unit may be controlled and the amount of emitted light of the light emitting unit may be controlled by the transistor.

Note that, in the description according to the disclosure, the phrase "electrically coupled" is used as e.g. a specific member (hereinafter, referred to as "A member") "electrically coupled" to another specific member (hereinafter, referred to as "B member") or the like. In the description according to the disclosure, in the case of the example, the phrase "electrically coupled" is used to include the case where the A member and the B member are in direct contact and electrically coupled and the case where the A member and the B member are electrically coupled via another member.

In the light emitting device according to the disclosure, the light emitting unit may have a light propagation layer provided between the adjacent nanostructures and propagating the light generated in the light emitting unit.

In the light emitting device, the light generated in the light emitting layer may propagate in the in-plane direction of the base, be gained in the light emitting layer, and laser-oscillate.

In the light emitting device according to the disclosure, an insulating layer may be provided on a side wall of the light emitting unit.

In the light emitting device, leakage of the current injected in the light emitting unit from the side wall may be suppressed by the insulating layer.

The light emitting device according to the disclosure includes a metal layer provided on a surface of the insulating layer, and the metal layer may be coupled to an interconnection electrically coupled to the third semiconductor layer.

In the light emitting device, the resistance to the current injected in the third semiconductor layer may be made smaller.

In the light emitting device according to the disclosure, the first semiconductor layer may be a GaN layer, InGaN layer, AlGaN layer, AlGaAs layer, InGaAs layer, InGaAsP layer, InP layer, GaP layer, or AlGaP layer.

In the light emitting device, for example, stress generated due to a difference between the lattice constant of the first semiconductor layer and the lattice constant of the second semiconductor layer may be suppressed.

In the light emitting device according to the disclosure, the light emitting units may be provided in an array form.

In the light emitting device, a self-emitting imager that may form a picture with the single light emitting unit as a pixel may be configured.

A projector according to the disclosure includes the light emitting device according to the disclosure.

The projector may include the light emitting device according to the disclosure.

DESCRIPTION OF EXEMPLARY EMBODIMENTS

As below, preferred embodiments of the disclosure will be explained in detail using the drawings. Note that the embodiments to be described do not unduly limit the subject matter of the disclosure described in Claims. Further, not all configurations to be described are essential component elements of the disclosure.

1. First Embodiment 1.1. Light Emitting Device

Figure 1:
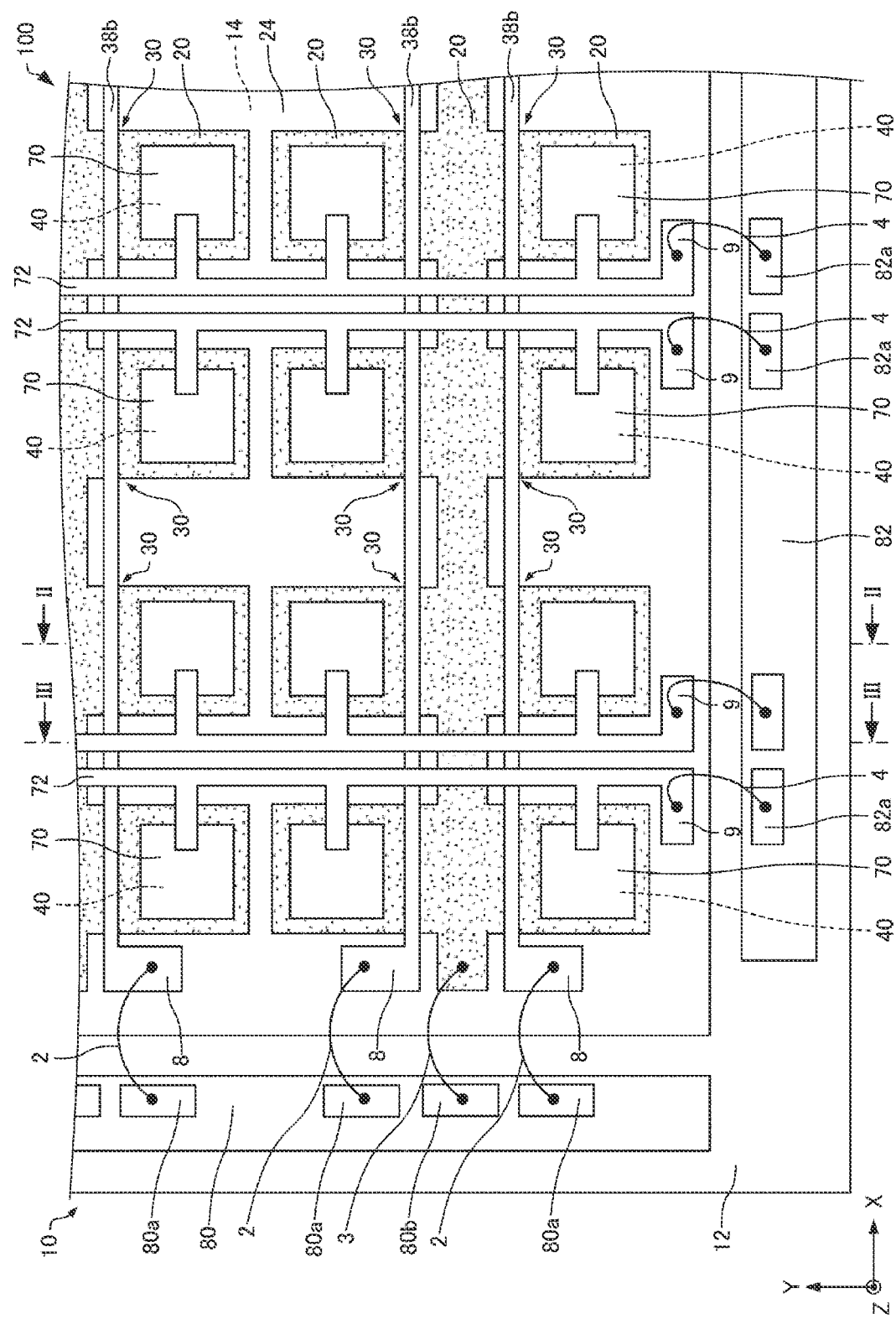
FIG. 1 is a plan view schematically showing a light emitting device according to a first embodiment.
Figure 2:
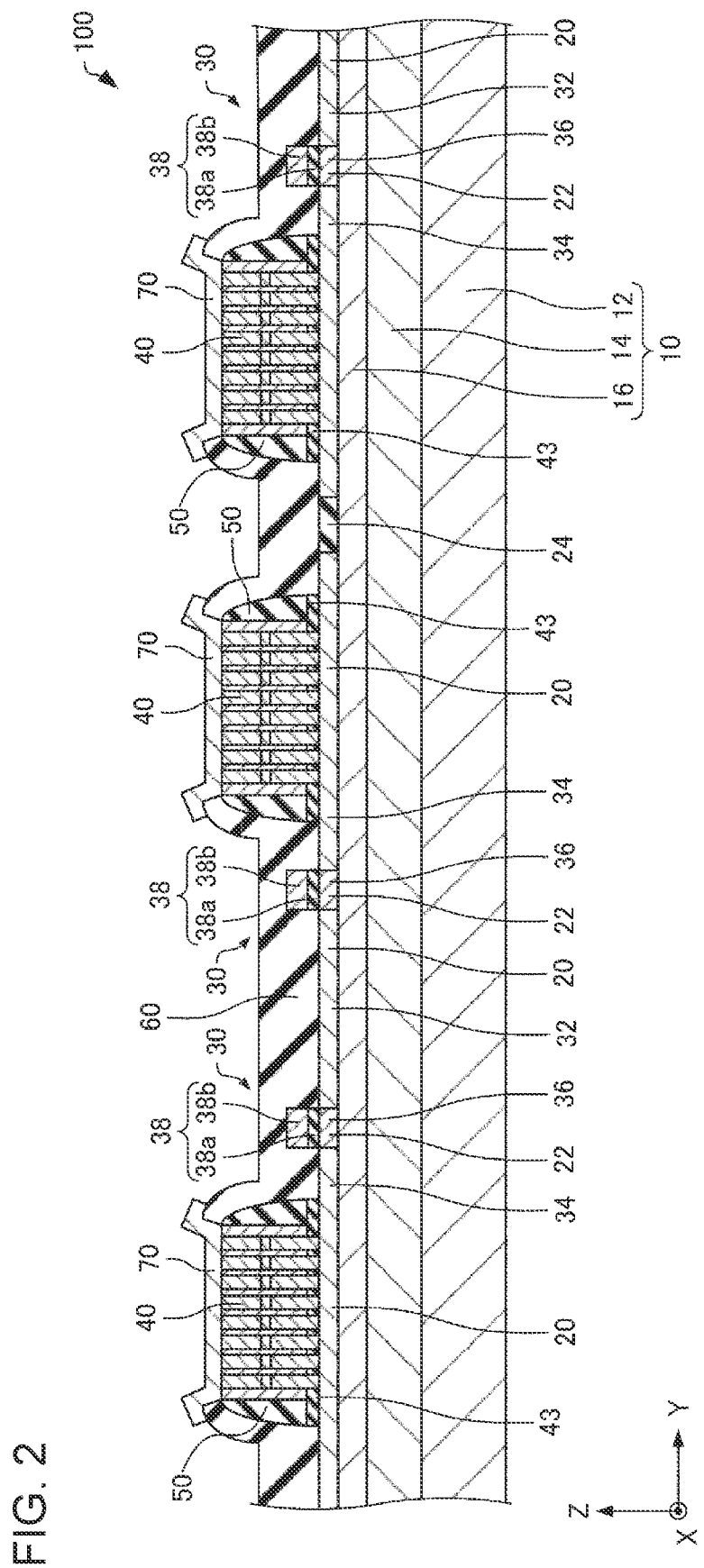
FIG. 2 is a sectional view schematically showing the light emitting device according to the first embodiment.
Figure 3:
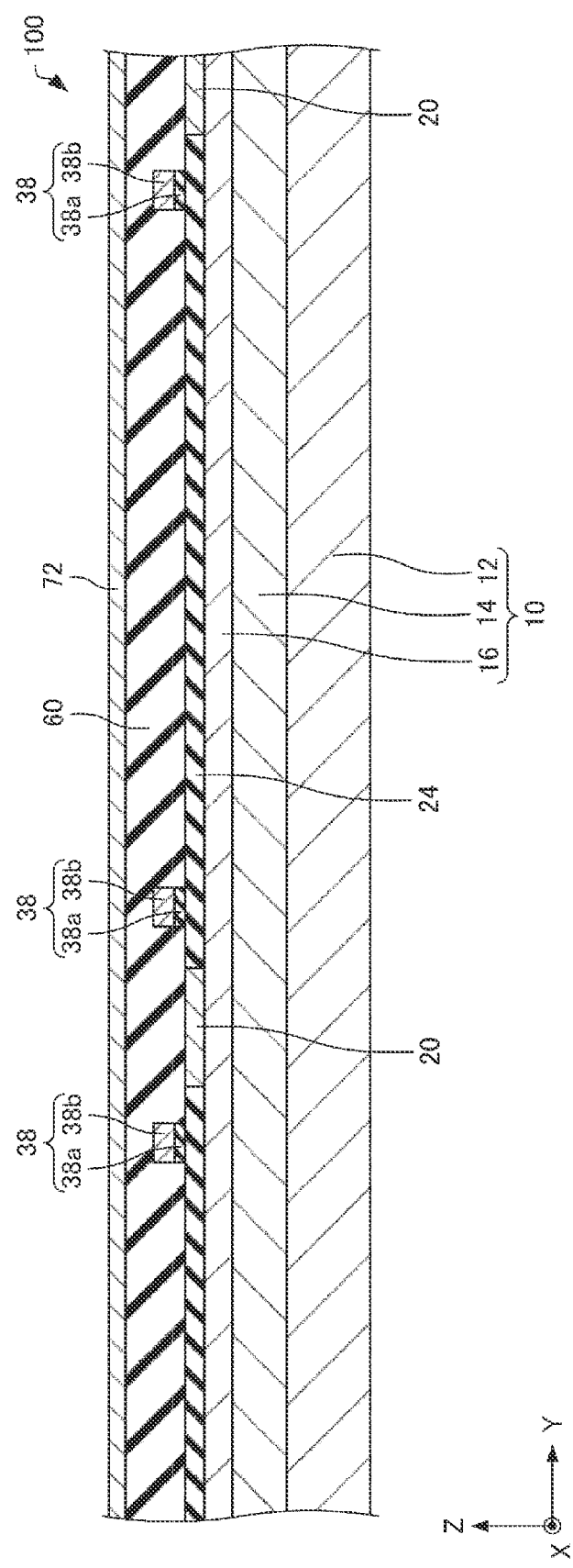
FIG. 3 is a sectional view schematically showing the light emitting device according to the first embodiment.
Figure 4:
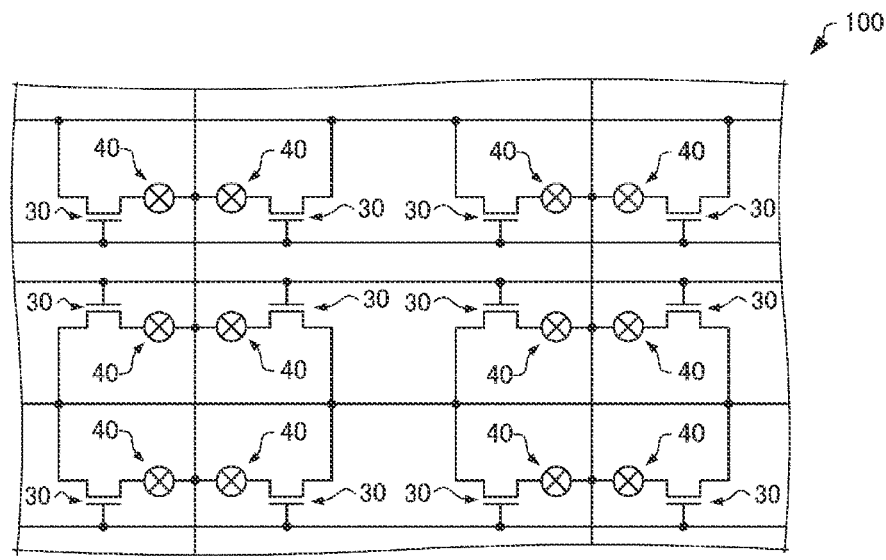
FIG. 4 is a circuit diagram of the light emitting device according to the first embodiment.

First, a light emitting device according to a first embodiment will be explained with reference to the drawings. FIG. 1 is a plan view schematically showing a light emitting device 100 according to the first embodiment. FIG. 2 is a sectional view along II-II line in FIG. 1 schematically showing the light emitting device 100 according to the first embodiment. FIG. 3 is a sectional view along III-III line in FIG. 1 schematically showing the light emitting device 100 according to the first embodiment. FIG. 4 is a circuit diagram of the light emitting device 100 according to the first embodiment. Note that, in FIGS. 1 to 3 and FIGS. 5 and 6, which will be described later, an X-axis, a Y-axis, and a Z-axis are shown as three axes orthogonal to one another.

As shown in FIGS. 1 to 4, the light emitting device 100 includes e.g. a base 10, semiconductor layers 20, 22, an element isolation layer 24, transistors 30, light emitting units 40, first insulating layers 50, a second insulating layer 60, conducting layers 70, interconnections 72, and drive circuits 80, 82. For convenience of explanation, the illustration of the second insulating layer 60 is omitted in FIG. 1.

As shown in FIG. 2, the base 10 has e.g. a first substrate 12, a second substrate 14, and a semiconductor layer 16. The first substrate 12 is e.g. a printed board. The second substrate 14 is provided on the first substrate 12. The second substrate 14 is e.g. a sapphire substrate, Si substrate, GaN substrate, or the like. The semiconductor layer 16 is provided on the second substrate 14. The semiconductor layer 16 is e.g. an i-type GaN layer.

The semiconductor layers (first semiconductor layers) 20 are provided on the base 10 (on the semiconductor layer 16 in the illustrated example). The semiconductor layer 20 is e.g. an n-type GaN layer (specifically, a GaN layer doped with Si).

The semiconductor layers 22 are provided on the semiconductor layer 16. The semiconductor layers 22 are provided between the semiconductor layers 20. The semiconductor layers 22 are provided under gates 38 of the transistors 30. The semiconductor layer 22 is e.g. a p-type GaN layer (specifically, a GaN layer doped with Mg).

The element isolation layer 24 is provided on the semiconductor layer 16. As shown in FIG. 1, the element isolation layer 24 is provided around the semiconductor layers 20 in the plan view (as seen from a direction of the Z-axis, as seen from a stacking direction of a semiconductor layer 42a and a light emitting layer 42b of the light emitting unit 40). The element isolation layer 24 is e.g. an i-type GaN layer, a silicon oxide layer, a silicon nitride layer, or the like. The element isolation layer 24 electrically isolates the light emitting units 40 adjacent to each other in the X-axis direction.

As shown in FIG. 2, the transistor 30 has a source region 32, a drain region 34, a channel region 36, and the gate 38. The source region 32 and the drain region 34 are provided in the semiconductor layer 20. The channel region 36 is a region between the source region 32 and the drain region 34. The channel region 36 is provided in the semiconductor layer 22. For example, capacitance is formed in the channel region 36.

The gate 38 is provided on the semiconductor layer 22. The gate 38 controls the current flowing in the channel region 36. The gate 38 has a gate insulating layer 38a provided on the semiconductor layer 22 and a gate electrode 38b provided on the gate insulating layer 38a. The gate insulating layer 38a is e.g. a silicon oxide layer. The material of the gate insulating layer 38a is e.g. copper, aluminum, or the like.

A plurality of the transistors 30 are provided. The transistors 30 are provided in an array form. That is, the transistors 30 are provided side by side in predetermined directions. In the example shown in FIG. 1, the transistors 30 are provided side by side in the X-axis direction and the Y-axis direction (in a matrix form). The transistors 30 arranged in the X-axis direction have e.g. the common gate insulating layers 38a and gate electrodes 38b. In the illustrated example, the gate electrodes 38b extend in the X-axis direction from pads 8 provided on the element isolation layer 24. The plurality of gate electrodes 38b are arranged in the Y-axis direction. As shown in FIG. 2, the transistors 30 adjacent to each other in the Y-axis direction have e.g. the common source regions 32.

The transistors 30 are provided in correspondence with the light emitting units 40. In the embodiment, the number of the transistors 30 and the number of the light emitting units 40 are the same, and the transistors 30 are electrically coupled to the light emitting units 40. Specifically, the source region 32 or drain region 34 of the transistor 30 is electrically coupled to the semiconductor layer 42a of the light emitting unit 40. That is, even when the transistor 30 is OFF (no current flows in the channel region 36), the source region 32 or drain region 34 is electrically coupled to the semiconductor layer 42a. In the illustrated example, the drain region 34 is electrically coupled to the semiconductor layer 42a. The transistor 30 controls amounts of currents injected in nanostructures 42 of the light emitting unit 40. Further, the transistor 30 is controlled, and thereby, a time of light emission may be controlled with respect to each light emitting unit 40. Or, the amount of current injected in the light emitting unit 40 may be controlled by control of the transistor 30.

In the disclosure, the sentence that the transistors 30 are provided in correspondence with the light emitting units 40 represents that at least one transistor 30 is provided in correspondence with the light emitting unit 40. In the disclosure, the number of transistors provided in correspondence with the light emitting unit 40 is not limited to one, but a plurality of transistors may be provided in correspondence with the light emitting unit 40.

Figure 5:
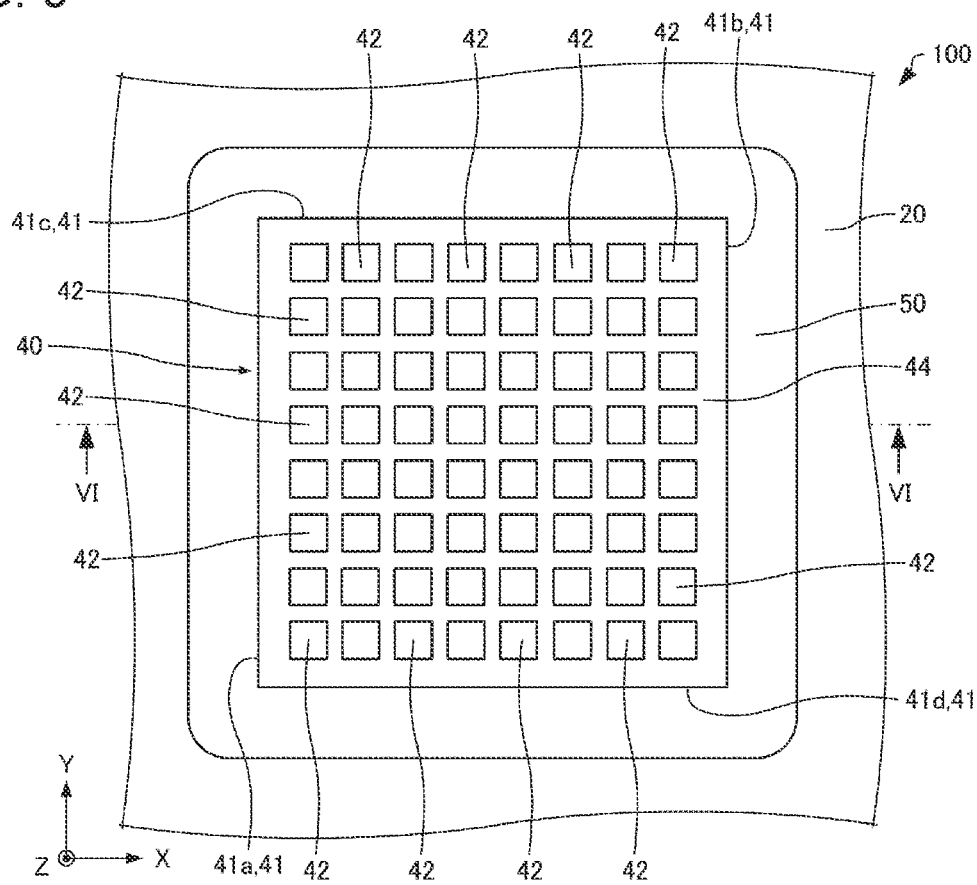
FIG. 5 is a plan view schematically showing the light emitting device according to the first embodiment.
Figure 6:
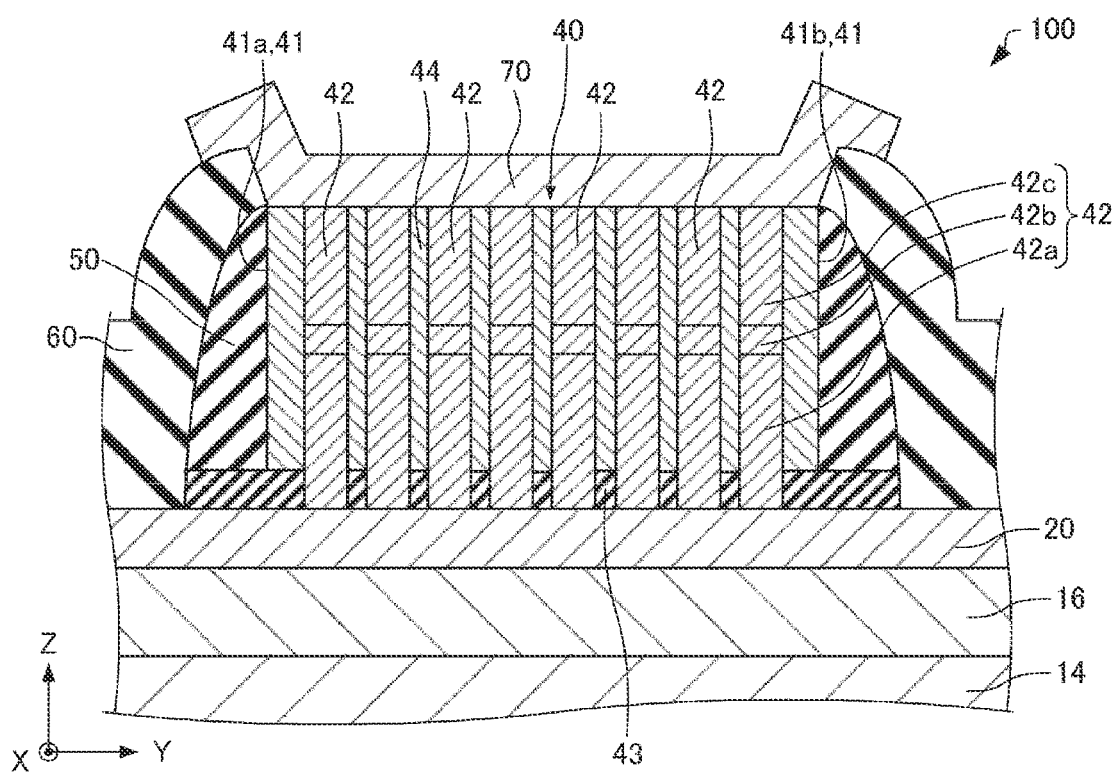
FIG. 6 is a sectional view schematically showing the light emitting device according to the first embodiment.

The light emitting units 40 are provided on the semiconductor layers 20. A plurality of the light emitting units 40 are provided. The light emitting units 40 are provided in an array form. That is, the light emitting units 40 are provided side by side in predetermined directions. In the example shown in FIG. 1, the light emitting units 40 are provided side by side in the X-axis direction and the Y-axis direction (in a matrix form). Here, FIG. 5 is a plan view schematically showing the light emitting unit 40. FIG. 6 is a sectional view along VI-VI line in FIG. 5 schematically showing the light emitting unit 40.

As shown in FIGS. 5 and 6, the light emitting unit 40 has the nanostructures 42 and a light propagation layer 44. For convenience of explanation, illustration of the conducting layer 70 and the second insulating layer 60 is omitted in FIG. 5.

Note that, in the disclosure, "upper" refers to a direction away from the base 10 as seen from the nanostructures in the Z-axis direction (the stacking direction of the semiconductor layer 42a and the light emitting layer 42b of the nanostructure 42), and "lower" refers to a direction closer to the base 10 as seen from the nanostructures 42 in the Z-axis direction.

The nanostructures 42 are provided on the semiconductor layer 20. The nanostructures 42 have columnar shapes. The nanostructures 42 are columnar portions projecting from the semiconductor layer 20. A plurality of the nanostructures 42 are provided. In the example shown in FIG. 5, the planar shape (the shape as seen from the Z-axis direction) of the nanostructure 42 is a rectangular shape. The diameter of the nanostructure 42 (in the case of a polygon, the diameter of the inscribed circle) is on the order of nanometers (less than 1 μm), and specifically 10 nm or more and 500 nm or less. The nanostructure 42 is also called e.g. a nanocolumn, nanowire, nanorod, or nanopillar. The size of the nanostructure 42 in the Z-axis direction is e.g. 0.1 μm or more and 5 μm or less. The plurality of nanostructures 42 are separated from one another. The distance between the adjacent nanostructures 42 is e.g. 1 nm or more and 500 nm or less.

Figure 7:
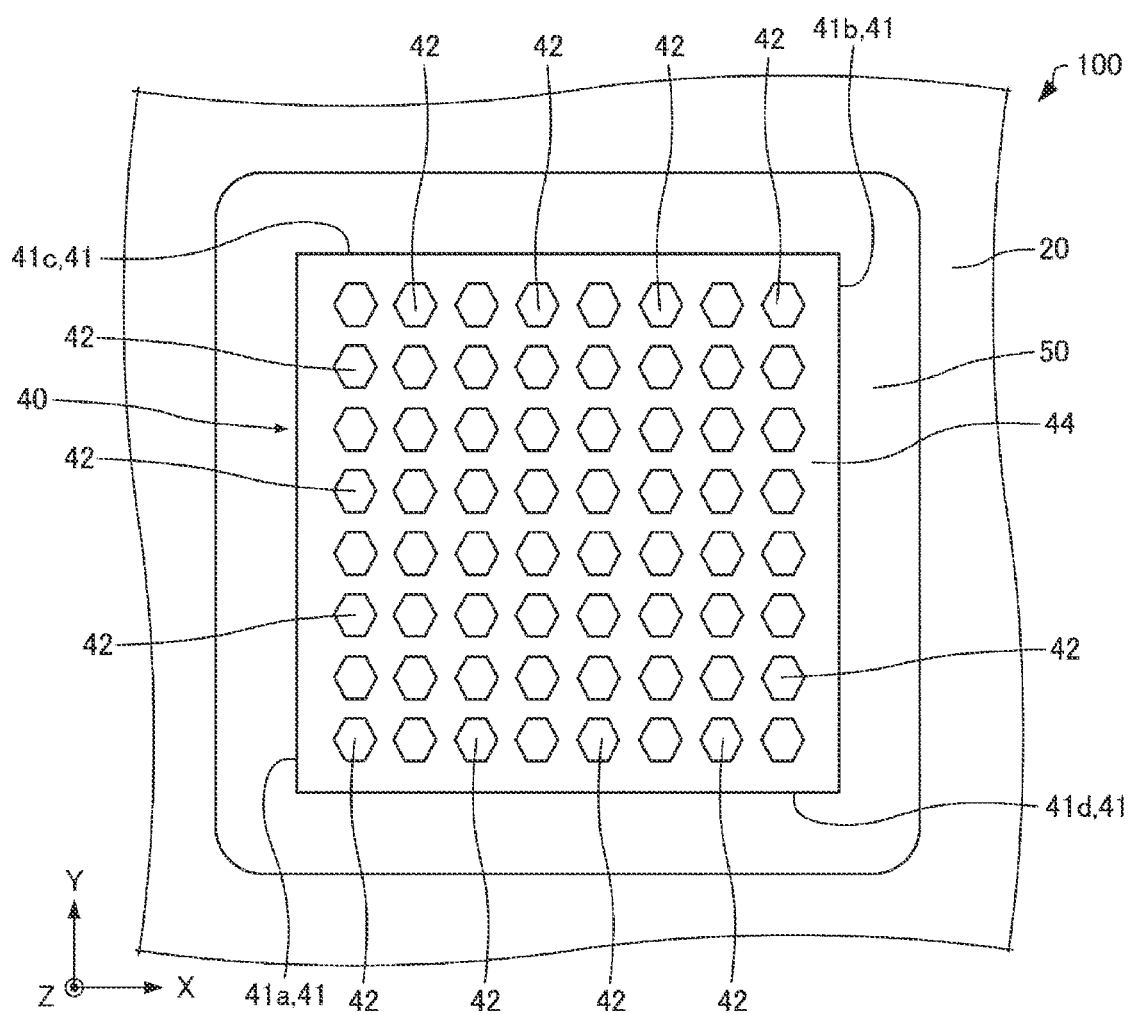
FIG. 7 is a plan view schematically showing the light emitting device according to the first embodiment.

Note that the planar shape of the nanostructure 42 is not particularly limited, but may be e.g. a hexagonal shape as shown in FIG. 7, rectangular shape, another polygonal shape than the hexagonal shape, circular shape, elliptical shape, or the like. In the illustrated examples, the nanostructures 42 have fixed diameters in the Z-axis direction, but may have different diameters in the Z-axis direction.

The plurality of nanostructures 42 are arranged in predetermined directions at predetermined pitches in the plan view. In the periodical structure, an optical confinement effect is obtained at a photonic band edge wavelength λ determined by the pitch, the diameters of the respective parts, and the refractive indexes of the respective parts. In the light emitting device 100, the light generated in the light emitting layer 42b of the nanostructure 42 contains the wavelength λ, and thereby, may express the effect of the photonic crystal. In the example shown in FIG. 5, the nanostructures 42 are provided side by side in the X-axis direction and the Y-axis direction (in a matrix form).

As shown in FIG. 6, the nanostructure 42 has the semiconductor layer (second semiconductor layer) 42a, the light emitting layer 42b, and a semiconductor layer (third semiconductor layer) 42c.

The semiconductor layer 42a is provided on the semiconductor layer 20. The semiconductor layer 42a is provided between the base 10 and the light emitting layer 42b. The semiconductor layer 42a is e.g. an n-type GaN layer (specifically, a GaN layer doped with Si).

The light emitting layer 42b is provided on the semiconductor layer 42a. The light emitting layer 42b is provided between the semiconductor layer 42a and the semiconductor layer 42c. The light emitting layer 42b is a layer that can emit a light with injection of a current. The light emitting layer 42b has e.g. a quantum well structure including a GaN layer and an InGaN layer. The numbers of the GaN layers and the InGaN layers forming the light emitting layer 42b are not particularly limited.

The semiconductor layer 42c is provided on the light emitting layer 42b. The semiconductor layer 42c is a layer having a different conductivity type from that of the semiconductor layer 42a. The semiconductor layer 42c is e.g. a p-type GaN layer (specifically, a GaN layer doped with Mg). The semiconductor layers 42a, 42c are cladding layers having a function of confining light in the light emitting layer 42b (suppressing leakage of light from the light emitting layer 42b).

In the light emitting device 100, a pin diode is formed by the p-type semiconductor layer 42c, the light emitting layer 42b doped with no impurity, and the n-type semiconductor layer 42a. The semiconductor layers 42a, 42c are layers having larger band gaps than the light emitting layer 42b. In the light emitting device 100, when a forward bias voltage of the pin diode is applied (a current is injected) between the conducting layer 70 and the semiconductor layer 20, recombination between the electron and the hole occurs in the light emitting layer 42b. A light is emitted by the recombination. The light generated in the light emitting layer 42b propagates in a direction orthogonal to the Z-axis direction (planar direction) by the semiconductor layers 42a, 42c. The propagated light forms standing wave, is gained in the light emitting layer 42b, and laser-oscillates. Then, the light emitting device 100 outputs a +1st order diffracted light and a −1st order diffracted light as laser beams in the stacking directions (toward the conducting layer 70 side and the base 10 side).

In the light emitting device 100, the refractive indexes and the thicknesses of the semiconductor layers 42a, 42c and the light emitting layer 42b are designed so that intensity of the light propagating in the planar direction may be the highest in the light emitting layer 42b in the Z-axis direction.

Though not shown in the drawings, a reflection layer may be provided between the base 10 and the semiconductor layer 20 or under the base 10. The reflection layer is e.g. a DBR (Distributed Bragg Reflector) layer. The light generated in the light emitting layer 42b may be reflected by the reflection layer, and the light emitting device 100 may output the light only from the conducting layer 70 side.

In the illustrated example, third insulating layers 43 are provided on the semiconductor layer 20. The third insulating layers 43 are provided between the light propagation layers 44 and the semiconductor layer 20 and between the first insulating layers 50 and the semiconductor layer 20. The third insulating layers 43 function as masks for formation of the nanostructures 42. The third insulating layers 43 may be formed in the same process as that of the gate insulating layers 38a. Accordingly, the material and the thickness of the third insulating layers 43 may be the same as those of the gate insulating layers 38a.

The light propagation layer 44 is provided between the adjacent nanostructures 42. The light propagation layer 44 is provided on the third insulating layer 43. The light propagation layers 44 are provided to surround the nanostructures 42 in the plan view. The refractive index of the light propagation layer 44 is lower than the refractive index of the light emitting layer 42b. The light propagation layer 44 is e.g. a GaN layer or titanium oxide ($TiO_2$) layer. The GaN layer as the light propagation layer 44 may be of i-type, n-type, or p-type. The light propagation layer 44 may propagate the light generated in the light emitting layer 42b in the planar direction. In the example shown in FIG. 5, the planar shape of the light emitting unit 40 is a square shape.

Note that, in the disclosure, when "specific member (A member)" is formed from a plurality of materials, "refractive index of A member" refers to an average refractive index of the plurality of materials forming the A member.

As shown in FIG. 6, the first insulating layer 50 is provided on a side wall 41 of the light emitting unit 40. The first insulating layer 50 is provided in the planar direction of the light emitting layer 42b. The first insulating layer 50 is a side wall provided on the side wall 41 of the light emitting unit 40. In the illustrated example, the side wall 41 is formed by the light propagation layer 44. For example, as shown in FIG. 5, the side wall 41 has a first side surface 41a and a second side surface 41b facing each other, and a third side surface 41c and a fourth side surface 41d coupled to the side surfaces 41a, 41b and facing each other.

As shown in FIG. 6, the first insulating layer 50 is provided on the third insulating layer 43. The first insulating layer 50 is provided to surround the light emitting unit 40 in the plan view. The refractive index of the first insulating layer 50 is lower than the refractive index of the light propagation layer 44. The material of the first insulating layer 50 is e.g. silicon oxide ($SiO_2$), silicon nitride (SiN), or the like. The first insulating layer 50 is formed by e.g. a single layer.

The first insulating layer 50 may reflect the light generated in the light emitting layer 42b. The light generated in the light emitting layer 42b forms standing wave between the first side surface 41a and the second side surface 41b. Further, the light generated in the light emitting layer 42b forms standing wave between the third side surface 41c and the fourth side surface 41d.

As shown in FIG. 2, the second insulating layer 60 is provided on the semiconductor layer 20. The second insulating layer 60 is provided to cover the gates 38 and surfaces 56 of the first insulating layers 50. The second insulating layer 60 is e.g. a silicon oxide layer. The second insulating layer 60 has a function of protecting the transistors 30 and the light emitting units 40 from impact or the like.

The conducting layer 70 is provided on the light emitting unit 40. In the illustrated example, the conducting layer 70 is provided on the nanostructures 42 and the light propagation layers 44. A plurality of the conducting layers 70 are provided in correspondence with the number of the light emitting units 40. The conducting layer 70 is electrically coupled to the semiconductor layers 42c of the nanostructures 42. The conducting layer 70 is e.g. an ITO (Indium Tin Oxide) layer. The light generated in the light emitting layer 42b is transmitted and output through the conducting layer 70.

Though not shown in the drawings, a contact layer may be provided between the conducting layer 70 and the light emitting unit 40. The contact layer may be in ohmic contact with the conducting layer 70. The contact layer may be a p-type GaN layer.

As shown in FIG. 3, the interconnection 72 is provided on the second insulating layer 60. As shown in FIG. 1, the interconnection 72 extends in the Y-axis direction from a pad provided on the element isolation layer 24, branches according to the number of the conducting layers 70, and coupled to the conducting layers 70. The interconnection 72 is electrically coupled to the semiconductor layers 42c via the conducting layers 70. A plurality of the interconnections are provided. The plurality of interconnections 72 are arranged in the X-axis direction. The interconnection 72 crosses the gate electrodes 38b in the plan view. The material of the interconnection 72 is e.g. copper, aluminum, ITO, or the like. Though not illustrated, when the material of the interconnection 72 is ITO, the interconnection 72 may be provided to cover the entire surface of the conducting layers 70.

The first drive circuit 80 and the second drive circuit 82 are provided on the first substrate 12. In the example shown in FIG. 1, in the plan view, the first drive circuit 80 is provided on the negative side in the X-axis direction of the second substrate 14, and the second drive circuit 82 is provided on the negative side in the Y-axis direction of the second substrate 14. The drive circuits 80, 82 may inject currents in the light emitting layers 42b.

The first drive circuit 80 is electrically coupled to the gate electrodes 38b. In the illustrated example, the first drive circuit 80 has pads 80a and is electrically coupled to the gate electrodes 38b via wires 2 and the pads 8. Further, the first drive circuit 80 is electrically coupled to the semiconductor layers 20. In the illustrated example, the first drive circuit 80 has pads 80b and is electrically coupled to the semiconductor layers 20 via wires 3.

The second drive circuit 82 is electrically coupled to the interconnections 72. In the illustrated example, the second drive circuit 82 has pads 82a and is electrically coupled to the interconnections 72 via wires 4 and the pads 9. The materials of the wires 2, 3, 4 and the pads 8, 9, 80a, 80b, 82a are not particularly limited as long as the materials have conductivity. For example, the pad 8 is integrally provided with the gate electrode 38b. For example, the pad 9 is integrally provided with the interconnection 72. Note that, though not illustrated, the drive circuits 80, 82 may be formed on the second substrate 14.

The light emitting device 100 has e.g. the following features.

The light emitting device 100 includes the light emitting units 40 having the plurality of nanostructures 42 that can emit lights with injection of currents, and the transistors 30 provided in correspondence with the light emitting units 40 and controlling the amounts of currents injected in the nanostructures 42. Accordingly, in the light emitting device 100, amounts of emitted lights of the light emitting units 40 may be controlled. Further, in the light emitting device 100, the transistors 30 are controlled, and thereby, times of light emission may be controlled with respect to each light emitting unit 40.

The light emitting device 100 includes the base 10 and the first semiconductor layers 20 provided on the base 10, and the nanostructures 42 are columnar portions projecting from the first semiconductor layers 20. Accordingly, in the light emitting device 100, the possibility that dislocation generated due to the difference between the lattice constant of the base 10 and the lattice constant of the semiconductor layer 20 exists in regions at a fixed height or more of the nanostructures 42 may be reduced. Further, the first semiconductor layers 20 may function as e.g. cladding layers and suppress leakage of the lights generated in the light emitting units 40 toward the base 10 side.

In the light emitting device 100, the nanostructure 42 has the second semiconductor layer 42a, the third semiconductor layer 42c having the different conductivity type from that of the second semiconductor layer 42a, and the light emitting layer 42b that is provided between the second semiconductor layer 42a and the third semiconductor layer 42c and can emit a light with injection of a current. Accordingly, in the light emitting device 100, the possibility that dislocation generated due to the difference between the lattice constant of the base 10 and the lattice constant of the semiconductor layer 20 exists in the light emitting layers 42b may be reduced.

In the light emitting device 100, the source regions 32 and the drain regions 34 are provided in the first semiconductor layers 20. As described above, in the light emitting device 100, the transistors 30 and the light emitting units 40 may be formed on the same substrate (the single substrate 10). Therefore, in the light emitting device 100, downsizing may be realized compared to the case where the transistors 30 and the light emitting units 40 are provided on separate substrates.

In the light emitting device 100, the drain regions 34 are electrically coupled to the second semiconductor layers 42a. Accordingly, in the light emitting device 100, the amounts of currents injected in the light emitting units 40 may be controlled and the amounts of emitted lights of the light emitting units may be controlled by the transistors 30.

In the light emitting device 100, the light emitting units 40 have the light propagation layers 44 provided between the adjacent nanostructures 42 and propagating the lights generated in the light emitting layers 42b. Accordingly, in the light emitting device 100, the lights generated in the light emitting layers 42b may propagate in the in-plane direction (planar direction) of the base 10, be gained in the light emitting layers 42b, and laser-oscillate.

In the light emitting device 100, the first insulating layers 50 are provided on the side walls 41 of the light emitting units 40. Accordingly, in the light emitting device 100, leakage of the currents injected in the light emitting units 40 from the side walls 41 may be suppressed by the first insulating layers 50.

In the light emitting device 100, the first semiconductor layer 20 is the GaN layer. Accordingly, in the light emitting device 100, when the second semiconductor layer 42a is the GaN layer, stress generated due to the difference between the lattice constant of the first semiconductor layer 20 and the lattice constant of the second semiconductor layer 22 may be suppressed.

In the light emitting device 100, the light emitting units 40 are provided in the array form. Therefore, in the light emitting device 100, a self-emitting imager that may form a picture with the single light emitting unit 40 as a pixel may be configured.

In the light emitting device 100, the refractive index of the light propagation layer 44 is lower than the refractive index of the light emitting layer 42b. Accordingly, in the light emitting device 100, the light generated in the light emitting layer 42b may readily propagate in the light propagation layer 44 in the planar direction.

In the light emitting device 100, the first insulating layers 50 are provided to surround the light emitting units 40. Accordingly, in the light emitting device 100, leakage of the currents injected in the light emitting units 40 to the interconnections 72 may be suppressed more reliably. In the light emitting device 100, the standing wave may be formed between the first side surface 41a and the second side surface 41b of the light emitting unit 40 and between the third side surface 41c and the fourth side surface 41d of the light emitting unit 40. Therefore, in the light emitting device 100, laser oscillation may be realized with lower threshold current density.

Note that, in the above description, the InGaN-containing light emitting layer 42b is explained, however, various materials that can emit lights with injection of currents may be used as the light emitting layer 42b. For example, semiconductor materials containing AlGaN, AlGaAs, InGaAs, InGaAsP, InP, GaP, AlGaP, or the like may be used. The semiconductor layers 20, 22, 42a, 42c are not limited to the GaN layers, but formed from materials adapted to the above described materials. The semiconductor layers 20, 22, 42a, 42c may be e.g. InGaN layers, AlGaN layers, AlGaAs layers, InGaAs layers, InGaAsP layers, InP layers, GaP layers, AlGaP layers, or the like.

Further, in the light emitting device 100, the plurality of light emitting layers 42b are not necessarily formed using the same semiconductor materials. For example, the semiconductor materials forming the light emitting layers 42b are varied, and thereby, the light emitting units 40 that output red lights, the light emitting units 40 that output green lights, and the light emitting units 40 that output blue lights may be provided on the same base 10.

Further, in the above description, the form in which the source regions 32 and the drain regions 34 of the transistors 30 are provided in the semiconductor layers 20 is explained, however, in the light emitting device according to the disclosure, the transistors corresponding to the light emitting units may be provided in a drive circuit. Or, the transistors corresponding to the light emitting units may be provided in another base than the base 10.

1.2. Manufacturing Method of Light Emitting Device

Figure 8:
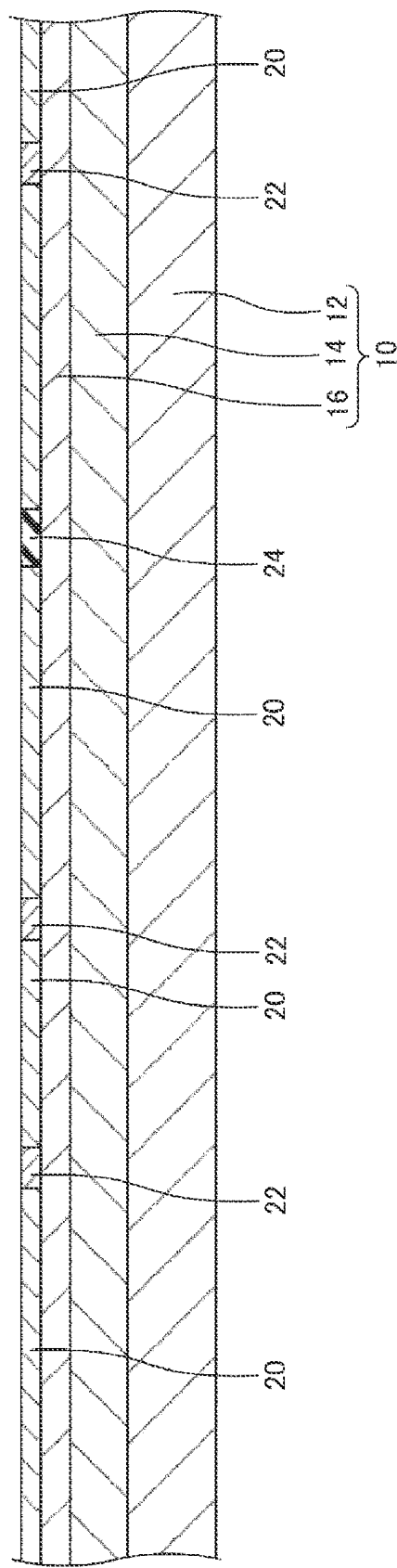
FIG. 8 is a sectional view schematically showing a manufacturing process of the light emitting device according to the first embodiment.
Figure 9:
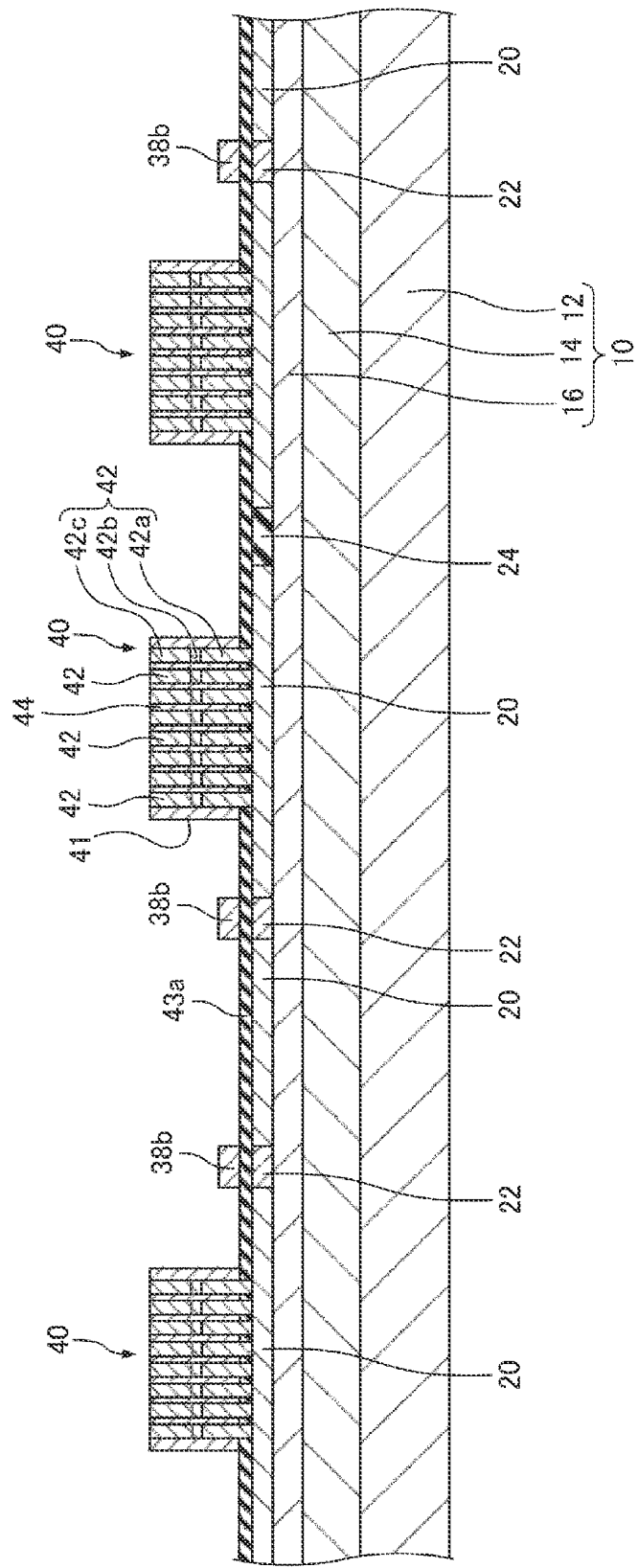
FIG. 9 is a sectional view schematically showing the manufacturing process of the light emitting device according to the first embodiment.
Figure 10:
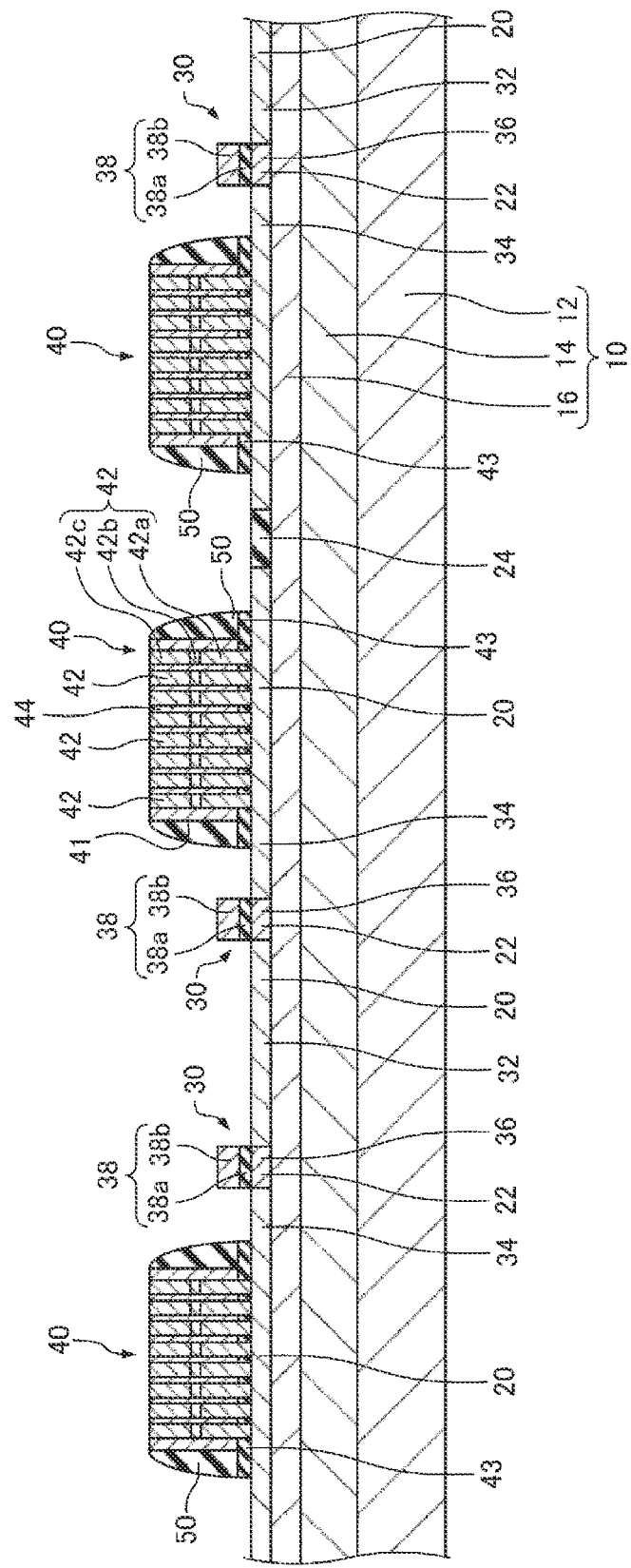
FIG. 10 is a sectional view schematically showing the manufacturing process of the light emitting device according to the first embodiment.

Next, a manufacturing method of the light emitting device 100 according to the first embodiment will be explained with reference to the drawings. FIGS. 8 to 10 are sectional views schematically showing a manufacturing process of the light emitting device 100 according to the first embodiment.

As shown in FIG. 8, the second substrate 14 is joined to the first substrate 12 using e.g. a joining member (not shown). Then, the semiconductor layer 16 and the semiconductor layer 20 are epitaxially grown on the second substrate 14 in this order. Then, the semiconductor layer 20 is patterned and a plurality of opening portions are formed in predetermined locations. Then, the semiconductor layers are epitaxially grown in the opening portions, and the element isolation layer 24 is epitaxially grown in the other opening portion. The epitaxial growth method includes e.g. an MOCVD (Metal Organic Chemical Vapor Deposition) method and MBE (Molecular Beam Epitaxy) method. The patterning is performed using e.g. photolithography and etching.

As shown in FIG. 9, a third insulating layer 43a is formed on the semiconductor layers 20, 22 and the element isolation layer 24. The third insulating layer 43a is formed by deposition using e.g. a CVD (Chemical Vapor Deposition) method or sputtering method and patterning using photolithography and etching (hereinafter, also simply referred to as "patterning").

Then, the gate electrodes 38b are formed on the third insulating layer 43a. The gate electrodes 38b are formed by e.g. deposition using a sputtering method or vacuum evaporation method and patterning.

Then, the semiconductor layers 42a, the light emitting layers 42b, and the semiconductor layers 42c are epitaxially grown on the semiconductor layers 20 in this order using the third insulating layer 43a as a mask by e.g. the MOCVD method or MBE method. At the step, the nanostructures 42 may be formed.

Then, the light propagation layers 44 are formed around the nanostructures 42. The light propagation layers 44 are formed by e.g. an ELO (Epitaxial Lateral Overgrowth) method including the MOCVD method and the MBE method. At the above described step, the light emitting units 40 may be formed. Note that the order of the step of forming the light emitting units 40 and the step of forming the gate insulating layers 38a is not particularly limited.

As shown in FIG. 10, the first insulating layers 50 are formed on the side walls 41 of the light emitting units 40. The first insulating layers 50 are formed by e.g. deposition of an insulating layer (not shown) on the entire surface of the substrate (the substrate having the semiconductor layers 20, 22, the element isolation layer 24, and the light emitting units 40) and etch back of the insulating layer. At the step, for example, the third insulating layer 43a may be etched, and the third insulating layers 43 and the gate insulating layers 38a are formed. As described above, in the manufacturing method of the light emitting device 100, the third insulating layers 43 and the gate insulating layers 38a may be formed at the same step, and the manufacturing process may be shortened compared to the case where the third insulating layers 43 and the gate insulating layers 38a are formed at separate steps.

As shown in FIG. 2, the second insulating layer 60 is formed on the semiconductor layers 20 and the element isolation layer 24 to cover the gates 38 and the first insulating layers 50. The second insulating layer 60 is formed by e.g. deposition using a spin coating method or CVD method and patterning.

Then, the conducting layers 70 are formed on the light emitting units 40. The conducting layers 70 are formed by e.g. deposition using a sputtering method or vacuum evaporation method and patterning.

As shown in FIGS. 1 and 3, the interconnections 72 are formed on the second insulating layer 60 and the conducting layers 70. The interconnections 72 are formed by e.g. deposition using a sputtering method or vacuum evaporation method and patterning.

As shown in FIG. 1, the drive circuits 80, 82 are mounted on the first substrate 12 using e.g. joining members (not shown). Then, the electrical couplings are made by the wires 2, 3, 4.

In the above described process, the light emitting device 100 may be manufactured.

1.3. Modified Examples of Light Emitting Device

1.3.1. First Modified Example

Figure 11:
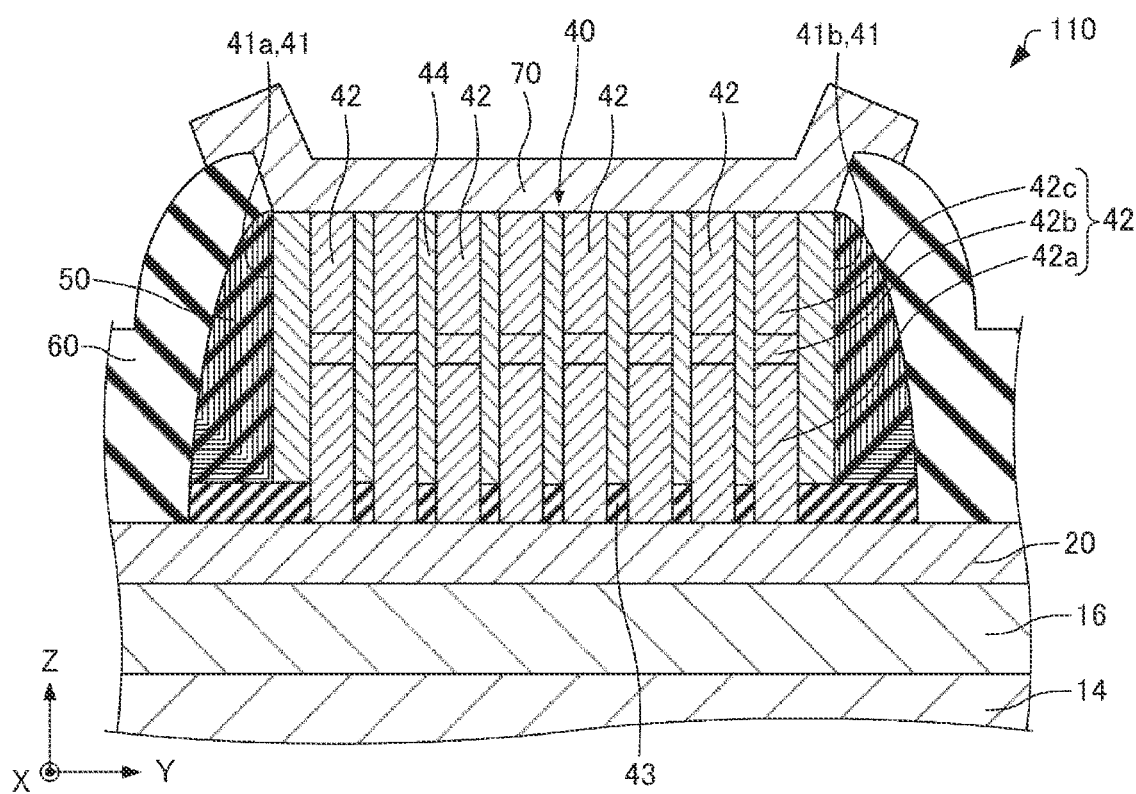
FIG. 11 is a sectional view schematically showing a light emitting device according to a first modified example of the first embodiment.

Next, a light emitting device according to a first modified example of the first embodiment will be explained with reference to the drawings. FIG. 11 is a sectional view schematically showing a light emitting device 110 according to the first modified example of the first embodiment. Note that, in FIG. 11, an X-axis, a Y-axis, and a Z-axis are shown as three axes orthogonal to one another.

As below, in the light emitting device 110 according to the first modified example of the first embodiment, members having the same functions as the component members of the above described light emitting device 100 have the same signs and the detailed explanation thereof will be omitted. This applies to a light emitting device according to a second modified example of the first embodiment to be described.

In the above described light emitting device 100, as shown in FIG. 6, the first insulating layer 50 is formed by e.g. the single layer. On the other hand, in the light emitting device 110, as shown in FIG. 11, the first insulating layer 50 is formed by a plurality of layers.

The light emitting device 110 may have the same effects as the above described light emitting device 100.

In the light emitting device 110, the first insulating layer 50 is formed by the plurality of layers. Accordingly, in the light emitting device 110, for example, compared to the case where the first insulating layer 50 is formed by a single layer, the resistance or capacitance of the first insulating layer 50 may be easily adjusted.

1.3.2. Second Modified Example

Figure 12:
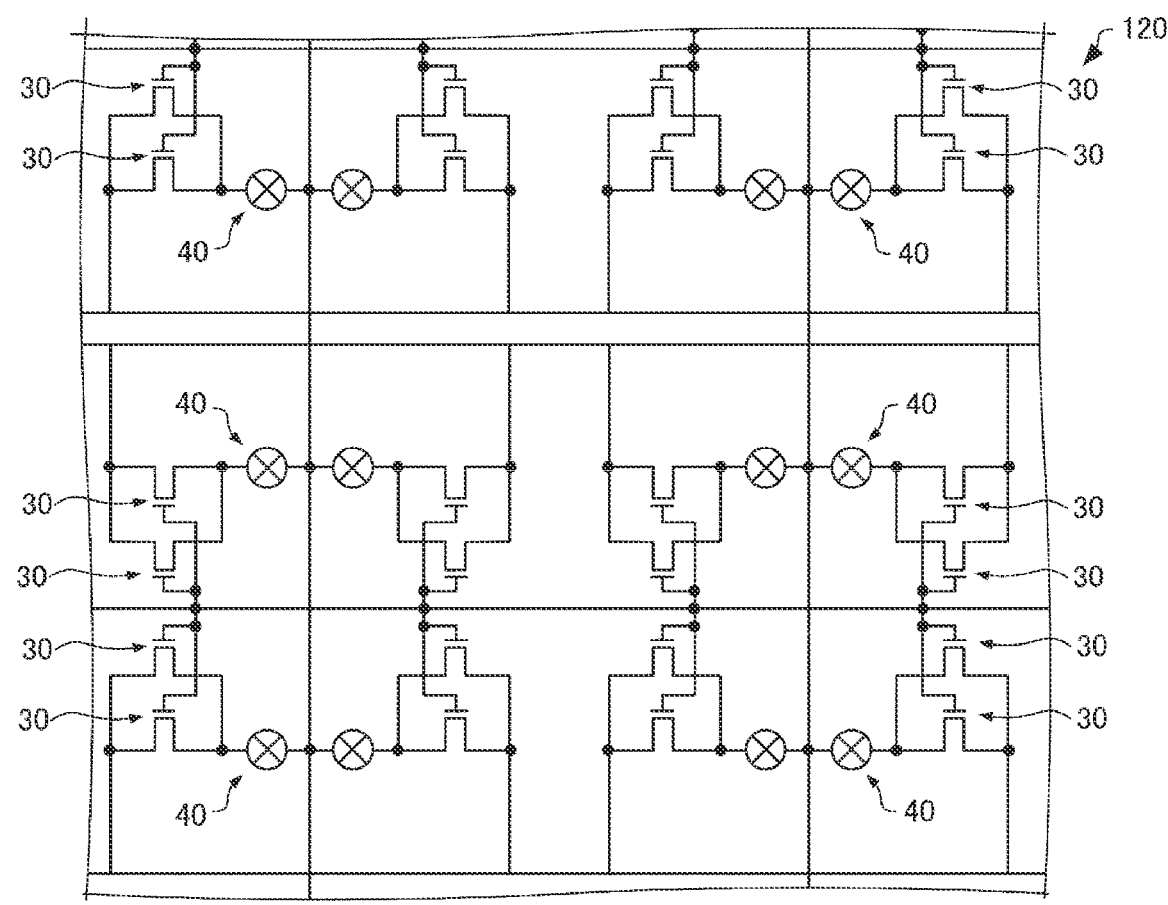
FIG. 12 is a circuit diagram of a light emitting device according to a second modified example of the first embodiment.

Next, a light emitting device according to a second modified example of the first embodiment will be explained with reference to the drawings. FIG. 12 is a sectional view schematically showing a light emitting device 110 according to the second modified example of the first embodiment.

In the above described light emitting device 100, as shown in FIG. 4, the single transistor 30 is provided in correspondence with the light emitting unit 40. On the other hand, in the light emitting unit 120, as shown in FIG. 12, a plurality of the transistors 30 are provided in correspondence with the light emitting unit 40. In the illustrated example, the two transistors 30 are provided in correspondence with the light emitting unit 40. Note that, though not illustrated, in the light emitting unit 120, the transistors 30 in the same number as that of the nanostructures 42 may be provided in correspondence with each light emitting unit 40.

The light emitting unit 120 may have the same effects as the above described light emitting device 100.

2. Second Embodiment

2.1. Light Emitting Device

Figure 13:
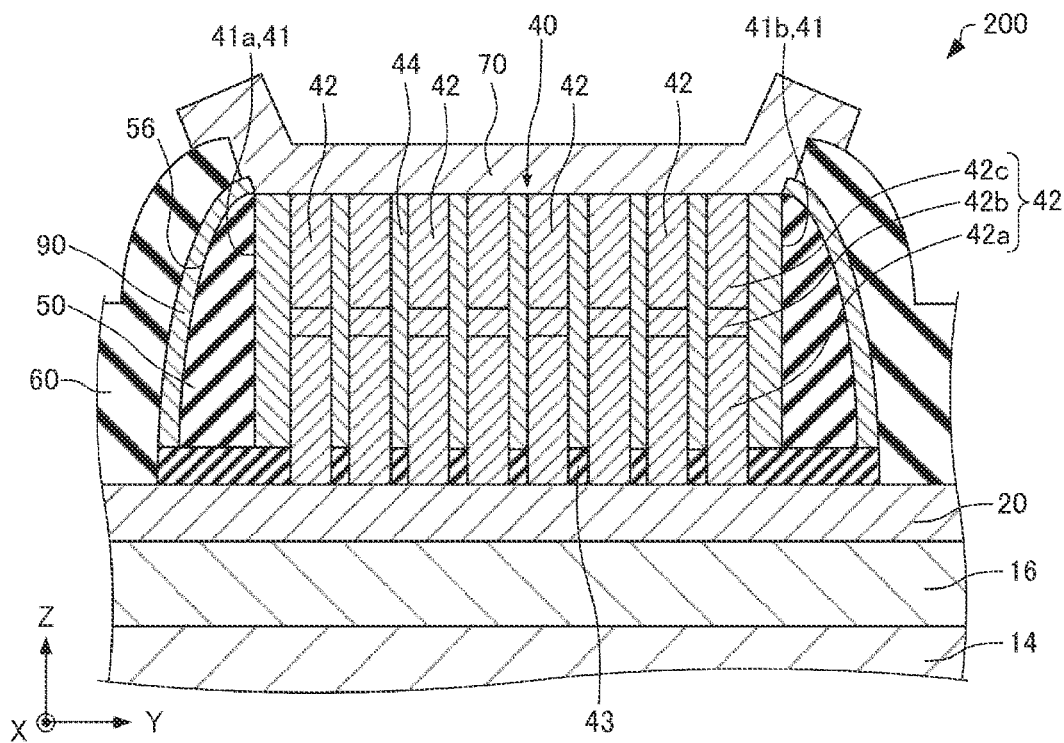
FIG. 13 is a sectional view schematically showing a light emitting device according to a second embodiment.

Next, a light emitting device according to a second embodiment will be explained with reference to the drawings. FIG. 13 is a sectional view schematically showing a light emitting device 200 according to the second embodiment. Note that, in FIG. 13 and FIG. 14, which will be described later, an X-axis, a Y-axis, and a Z-axis are shown as three axes orthogonal to one another.

As below, in the light emitting device 200 according to the second embodiment, members having the same functions as the component members of the above described light emitting device 100 have the same signs and the detailed explanation thereof will be omitted.

As shown in FIG. 13, the light emitting device 200 is different from the above described light emitting device 100 in that metal layers 90 are provided.

The metal layers 90 are provided on surfaces 56 of the first insulating layers 50. The metal layer 90 is provided in the planar direction of the light emitting layer 42b. In the illustrated example, the metal layer 90 is provided between the first insulating layer 50 and the second insulating layer 60. The metal layer 90 is provided separately from the semiconductor layer 20. In the illustrated example, the third insulating layer 43 is located between the metal layer 90 and the semiconductor layer 20. The third insulating layer 43 electrically isolates between the metal layer 90 and the semiconductor layer 20. The metal layer 90 is e.g. a silver layer, copper layer, aluminum layer, or the like.

The light emitting device 200 may have the same effects as the above described light emitting device 100.

The light emitting device 200 includes the metal layers 90 provided on the surfaces 56 of the first insulating layers 50. Here, though not illustrated, if the metal layer 90 is provided directly on the side wall 41 of the light emitting unit 40, the metal layer 90 absorbs visible light at a predetermined rate. Thus, it is not preferable that the metal layer 90 is provided directly on the side wall 41. When the metal layer 90 absorbs light, the metal layer 90 generates heat and the temperature characteristics of the light emitting device may be deteriorated. In the light emitting device 200, the first insulating layer 50 is provided between the light emitting unit 40 and the metal layer 90, and the above described problem may be avoided.

Figure 14:
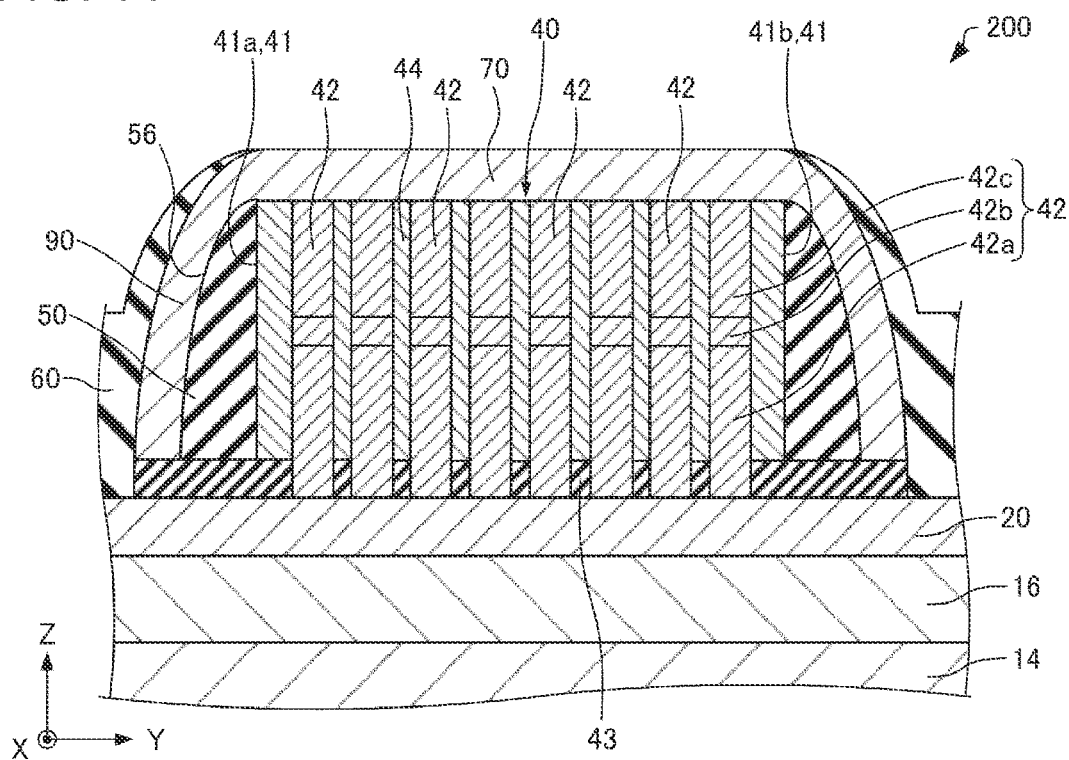
FIG. 14 is a sectional view schematically showing the light emitting device according to the second embodiment.

Note that, in the light emitting device 200, as shown in FIG. 14, the metal layer 90 may be integrally provided with the conducting layer 70. In this case, the manufacturing process may be shortened compared to the case where the metal layer 90 and the conducting layer 70 are formed at separate steps.

2.2. Manufacturing Method of Light Emitting Device

Next, a manufacturing method of the light emitting device 200 according to the second embodiment will be explained. The manufacturing method of the light emitting device 200 according to the second embodiment is basically the same as the manufacturing method of the light emitting device 100 according to the above described first embodiment except that the metal layers 90 are formed by e.g. deposition using a sputtering method or vacuum evaporation method and patterning. Therefore, the detailed explanation thereof will be omitted.

2.3. Modified Example of Light Emitting Device

Figure 15:
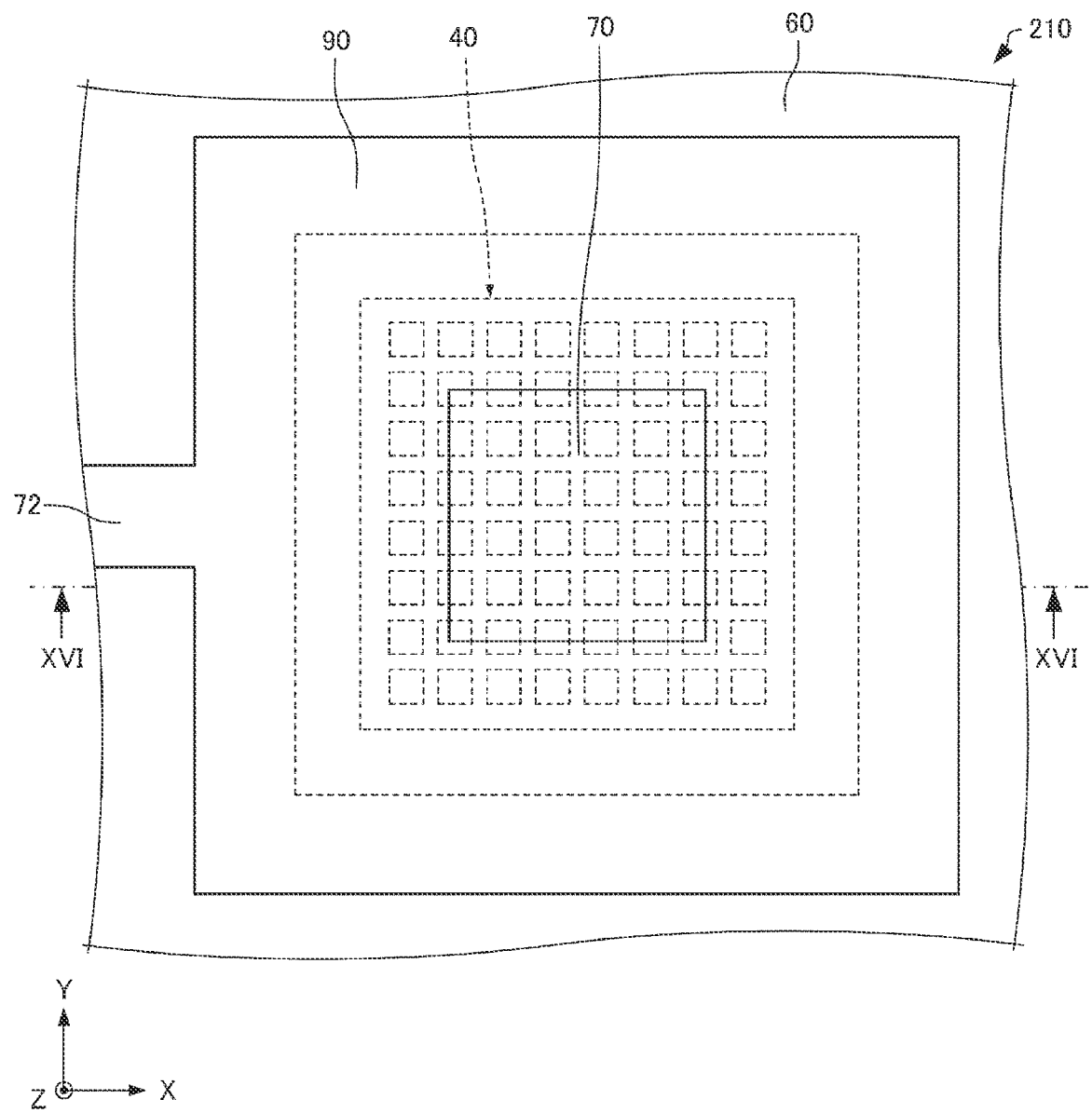
FIG. 15 is a plan view schematically showing a light emitting device according to a modified example of the second embodiment.
Figure 16:
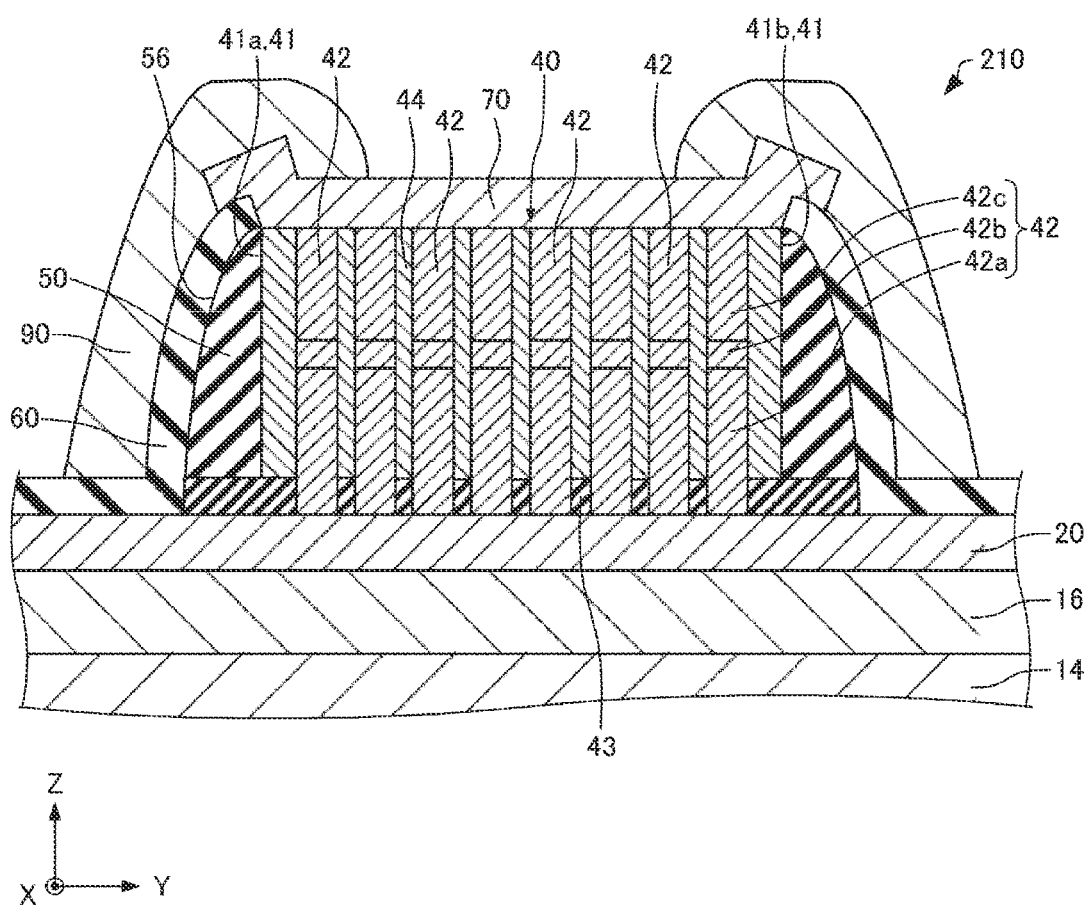
FIG. 16 is a sectional view schematically showing the light emitting device according to the modified example of the second embodiment.

Next, a light emitting device according to a modified example of the second embodiment will be explained with reference to the drawings. FIG. 15 is a plan view schematically showing a light emitting device 210 according to the modified example of the second embodiment. FIG. 16 is a sectional view along XVI-XVI line in FIG. 15 schematically showing the light emitting device 210 according to the modified example of the second embodiment. Note that, in FIGS. 15 and 16, an X-axis, a Y-axis, and a Z-axis are shown as three axes orthogonal to one another.

As below, in the light emitting device 210 according to the modified example of the second embodiment, members having the same functions as the component members of the above described light emitting devices 100, 200 have the same signs and the detailed explanation thereof will be omitted.

In the above described light emitting device 200, as shown in FIG. 13, the metal layer 90 is provided directly on the surface 56 of the first insulating layer 50. On the other hand, in the light emitting device 210, as shown in FIG. 16, the metal layer 90 is provided on the surface 56 of the first insulating layer 50 via the second insulating layer 60.

As shown in FIG. 15, the metal layer 90 is coupled to the interconnection 72. In the illustrated example, the metal layer 90 is integrally provided with the interconnection 72. The metal layer 90 has e.g. a frame-like shape in the plan view. In the plan view, the outer edge of the light emitting unit 40 and the outer edge of the conducting layer 70 overlap with the metal layer 90.

The light emitting device 210 may have the same effects as the above described light emitting device 200.

In the light emitting device 210, the metal layer 90 is coupled to the interconnection 72 electrically coupled to the third semiconductor layers 42c. Accordingly, in the light emitting device 210, the resistance to the currents injected in the third semiconductor layers 42c may be made smaller.

In the light emitting device 210, the metal layer 90 is integrally provided with the interconnection 72. Accordingly, in the light emitting device 210, the manufacturing process may be shortened compared to the case where the metal layer 90 and the interconnection 72 are formed at separate steps.

3. Third Embodiment

Next, a projector according to a third embodiment will be explained with reference to the drawings. FIG. 16 schematically shows a projector 300 according to the third embodiment. Note that, for convenience, in FIG. 17, the housing forming the projector 300 is omitted.

Figure 17:
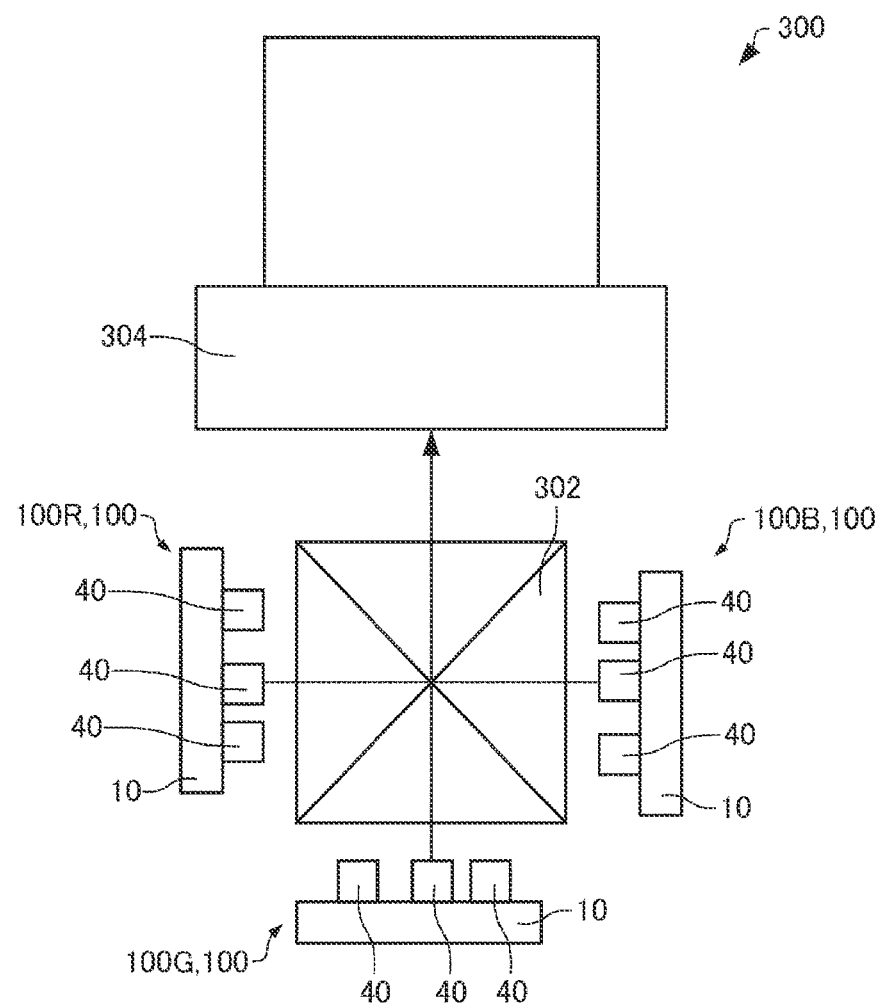
FIG. 17 schematically shows a projector according to a third embodiment.

The projector 300 includes the light emitting device according to the disclosure. As below, as shown in FIG. 17, the projector 300 including the light emitting devices 100 (light emitting devices 100R, 100G, 100B) will be explained.

The projector 300 includes a housing (not shown), the light emitting devices 100R, 100G, 100B provided in the housing, a cross dichroic prism (color combining means) 302, and a projection lens (projection device) 304. Note that, for convenience, in FIG. 17, the housing forming the projector 300 is omitted and the light emitting devices 100R, 100G, 100B are simplified.

The light emitting devices 100R, 100G, 100B output a red light, a green light, and a blue light, respectively. The light emitting devices 100R, 100G, 100B control (modulate) the respective light emitting units 40 as picture pixels according to image information, and thereby, may directly form a picture without using e.g. liquid crystal light valves (light modulation devices).

The lights output from the light emitting devices 100R, 100G, 100B enter the cross dichroic prism 302. The cross dichroic prism 302 combines and guide the lights output from the light emitting devices 100R, 100G, 100B to the projection lens 304. The projection lens 304 enlarges and projects the picture formed by the light emitting devices 100R, 100G, 100B on a screen (display surface) (not shown).

Specifically, the cross dichroic prism 302 is formed by bonding of four rectangular prisms in which a dielectric multilayer film reflecting the red light and a dielectric multilayer film reflecting the blue light are placed in a cross shape on the inner surfaces. The three color lights are combined by these dielectric multilayer films and a light representing a color image is formed. Then, the combined light is projected on the screen by the projection lens 304 as the projection system and the enlarged image is displayed.

The projector 300 includes the light emitting devices 100. Accordingly, in the projector 300, a picture may directly be formed without using e.g. liquid crystal light valves (light modulation devices). Therefore, in the projector 300, transmission loss (parts of the lights are not transmitted through the liquid crystal light valves) in the liquid crystal light valves may be suppressed and higher brightness may be realized. Further, in the projector 300, the number of components may be reduced and the lower cost may be realized. Furthermore, in the projector 300, the light emitting devices 100 outputting laser beams are provided, and thereby, projection can be performed from a distant location compared to the case where LED (Light Emitting Diode) lights are output.

Figure 18:
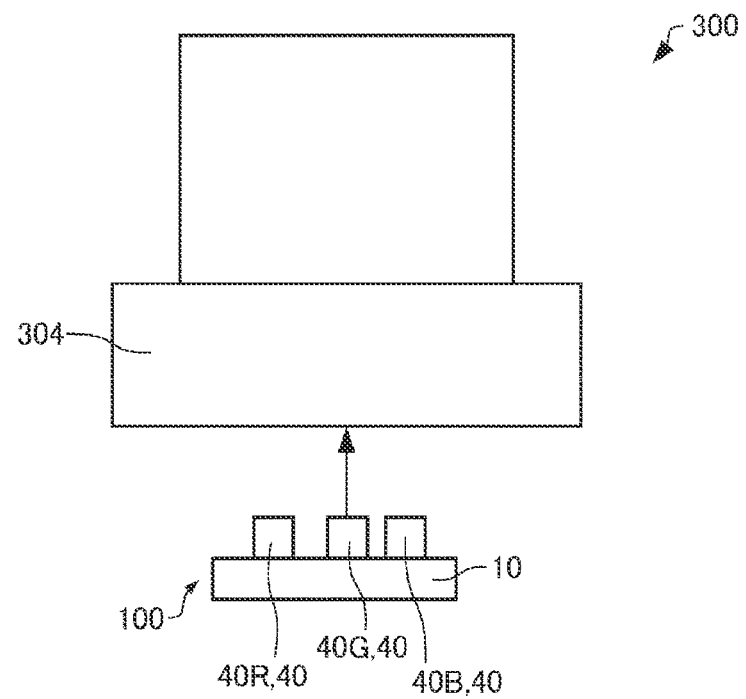
FIG. 18 schematically shows the projector according to the third embodiment.

Note that, for example, when the light emitting device 100 in which the light emitting units 40 (40R) outputting red lights, light emitting units 40 (40G) outputting green lights, and light emitting units 40 (40B) outputting blue lights are provided on the same base 10 is used, in the projector 300, as shown in FIG. 18, the lights output from the light emitting device 100 directly enter the projection lens 304, do not enter the cross dichroic prism. In this case, full-color image display can be performed with the single light emitting device 100 and downsizing may be realized compared to the example shown in FIG. 17.

The usage of the light emitting device according to the disclosure is not limited to the above described embodiments, but the device can be used as a light source of indoor and outdoor illumination lights, back lights of displays, laser printers, scanners, lights for automobiles, sensing apparatuses using lights, communication apparatuses, etc. in addition to the projector.

The disclosure includes configurations formed by omission of parts within the range in which the features and effects described in this application are provided or combination of the respective embodiments and modified examples.

The disclosure includes substantially the same configurations (e.g. the configurations having the same functions, methods, and results or the configurations having the same purposes and effects) as the configurations described in the embodiments. Further, the disclosure includes configurations formed by replacement of the inessential parts of the configurations described in the embodiments. Furthermore, the disclosure includes configurations that may fulfill the same functions and effects or may achieve the same purposes as the configurations described in the embodiments. Moreover, the disclosure includes configurations formed by addition of known techniques to the the configurations described in the embodiments.

What is claimed is:

1. A light emitting device comprising:
   a substrate;
   a light emitting unit positioned above the substrate, the light emitting unit including:
     a first semiconductor layer;
     a second semiconductor layer having a conductivity type different from a conductivity type of the first semiconductor layer; and
     a light emitting layer provided between the first semiconductor layer and the second semiconductor layer;
   a first insulating layer provided on a side wall of the light emitting unit; and
   a first electrical conducting layer provided on a surface of the first insulating layer, and on a surface of the second semiconductor layer,
   wherein the first electrical conducting layer includes:
     a first part that contacts the second semiconductor layer and includes a side facing the second semiconductor layer and an opposite side facing away from the second semiconductor layer;
     a second part that is provided outside of the first part in a plan view, the second part being inclined with respect to a direction normal to the substrate away from each of the substrate and the opposite side of the first part; and
     a third part that is provided outside of the second part in the plan view, the third part being inclined with respect to the direction normal to the substrate toward the substrate and away from the side facing the second semiconductor layer.

2. The light emitting device according to claim 1, further comprising:
   a second insulating layer that covers the first electrical conducting layer.

3. The light emitting device according to claim 1, wherein the first semiconductor layer includes a GaN layer, an InGaN layer, an AlGaN layer, an AlGaAs layer, an InGaAs layer, an InGaAsP layer, an InP layer, a GaP layer, or an AlGaP layer.

4. The light emitting device according to claim 1, wherein the light emitting device includes a plurality of light emitting units, and
   the light emitting units are provided in an array form.

5. The light emitting device according to claim 1, wherein
the light emitting unit includes a third semiconductor layer provided between the first semiconductor layer and the substrate, and
the third semiconductor layer includes an InP layer, or a GaP layer.

6. The light emitting device according to claim 1, further comprising:
a second electrical conducting layer provided on an opposite side of the light emitting unit from the substrate, wherein
the first electrical conducting layer is electrically connected to the second semiconductor layer via the second electrical conducting layer.

7. The light emitting device according to claim 6, wherein
the second electrical conducting layer is provided between the first electrical conducting layer and the second semiconductor layer.

8. The light emitting device according to claim 1, wherein in a cross-sectional view along a first direction, the first insulating layer includes a first portion extending along the first direction and a second portion covering the side wall of the light emitting unit, and
the first electrical conducting layer covers the first portion and the second portion.

9. A projector comprising the light emitting device according to claim 1.

10. The light emitting device according to claim 1, wherein in a plan view from a stacking direction of the first semiconductor layer and the light emitting layer, the second part overlaps the first insulating layer.

11. The light emitting device according to claim 1, wherein in a plan view from a stacking direction of the first semiconductor layer and the light emitting layer, the second part overlaps the light emitting unit.

12. The light emitting device according to claim 11, wherein in a plan view from the stacking direction, the second part overlaps the first insulating layer.

13. The light emitting device according to claim 1 further comprising a metal layer that covers an entirety of the second part and a portion of the first part.

* * * * *